United States Patent
Puzella et al.

(10) Patent No.: US 6,731,189 B2
(45) Date of Patent: May 4, 2004

(54) MULTILAYER STRIPLINE RADIO FREQUENCY CIRCUITS AND INTERCONNECTION METHODS

(75) Inventors: Angelo Puzella, Marlboro, MA (US); Joseph M. Crowder, Marlborough, MA (US); Patricia S. Dupuis, Medway, MA (US); Michael C. Fallica, Reading, MA (US)

(73) Assignee: Raytheon Company, Waltham, MA (US)

( * ) Notice: Subject to any disclaimer, the term of this patent is extended or adjusted under 35 U.S.C. 154(b) by 21 days.

(21) Appl. No.: 10/185,853

(22) Filed: Jun. 27, 2002

(65) Prior Publication Data

US 2004/0000979 A1 Jan. 1, 2004

(51) Int. Cl.⁷ ............... H01L 21/768; H01L 23/538
(52) U.S. Cl. ................ 333/246; 257/E21.585; 257/E23.174
(58) Field of Search ............ 257/E21.585, E23.174, 257/E21.586, E21.588; 333/246

(56) References Cited

U.S. PATENT DOCUMENTS

| | | |
|---|---|---|
| 3,193,789 A | 7/1965 | Brown |
| 3,867,759 A | 2/1975 | Slefker |
| 4,685,210 A | 8/1987 | King et al. |
| 5,479,703 A | 1/1996 | Desai et al. |
| 5,796,170 A * | 8/1998 | Marcantonio ........... 257/786 |
| 5,832,598 A | 11/1998 | Greenman et al. |
| 6,023,029 A * | 2/2000 | Armezzani et al. ...... 257/774 |
| 6,130,478 A | 10/2000 | Dumoulin et al. |
| 6,154,176 A | 11/2000 | Fathy et al. |
| 6,215,377 B1 | 4/2001 | Douriet |
| 6,239,385 B1 | 5/2001 | Schwiebert et al. |
| 6,272,742 B1 | 8/2001 | Armezzani et al. |
| 2001/0032740 A1 | 10/2001 | Kennedy et al. |

FOREIGN PATENT DOCUMENTS

| | | |
|---|---|---|
| GB | 2 057 195 A | 3/1981 |
| JP | 01237477 | 4/1991 |
| JP | 06110746 | 8/1995 |

OTHER PUBLICATIONS

PCT/US 03/16479 International Search Report dated Aug. 29, 2003.

* cited by examiner

Primary Examiner—Don P Le
(74) Attorney, Agent, or Firm—Daly, Crowley & Mofford, LLP.

(57) ABSTRACT

A multi-layer stripline assembly interconnection includes a first stripline sub-assembly having a first surface and a first plurality of vias disposed in the first surface adapted to receive a plurality of solid metal balls. The interconnection further includes a second stripline sub-assembly having a second plurality of vias disposed in the first surface of the second sub-assembly adapted to be aligned with the first plurality of vias. Reflowed solder is wetted to the second plurality of vias and to the corresponding plurality of solid metal balls.

20 Claims, 5 Drawing Sheets

MULTILAYER STRIPLINE RADIO FREQUENCY CIRCUITS AND INTERCONNECTION METHODS

CROSS-REFERENCE TO RELATED APPLICATIONS

Not applicable.

STATEMENTS REGARDING FEDERALLY SPONSORED RESEARCH

Not applicable.

FIELD OF THE INVENTION

This invention relates generally to radar system circuits and communications systems circuits and, more particularly, to multi-layer stripline radio frequency (RF) circuits and interconnection methods.

BACKGROUND OF THE INVENTION

As is known in the art, a radar or communications system generally includes a transmitter, a receiver, and an antenna having a feed circuit with at least one conductive member generally referred to as a reflector, radiator or antenna element. As is also known, an array antenna can include a plurality of sub-assemblies having phase-shifting elements and transmit/receive (T/R) elements disposed in an array having multiple layers interconnected to provide modules. RF signals can be phase-shifted and received or transmitted using the same radiator.

To enable the transmission of RF signals between the active T/R modules and the radiators, radar and communications systems utilize a plurality of RF transmission line circuits (also referred to as stripline circuits) which couple transmitted and received signals between the radiators and the active transmit/receive modules. The RF stripline circuits are conventionally provided as multiple layers of RF circuit boards that are stacked and bonded together for mechanical support and include RF transmission lines physically interconnected with plated vias. The interconnection of sub-assemblies is required because of restrictions in drilling and plating "blind" vias (i.e., vias interconnecting stripline circuits that extend only partially into a multilayer laminate).

Conventional approaches to interconnecting stripline circuits are limited by relatively tight process tolerances such that the number of laminated circuit board layers that can be interconnected is limited. A first known approach to interconnect circuits is to solder individual RF circuit boards together. This approach attempts to make the interconnection between pairs of via pads and between ground planes on each of two circuit boards. The reliability of soldering via pads is limited because the solder flow is difficult to control. Short circuits are sometimes caused by the solder bridging a relief area between a via and the ground plane. Open circuits sometimes result from a lack of solder (also referred to as solder starvation) connecting the via pads and the interconnection to other circuit elements. These reliability problems result from process parameters which are difficult to control.

Conventional soldering techniques require the fine tuning of multiple process parameters such as: solder volume, solder composition (i.e. the tin-lead (SnPb) percent composition), solder flow, bonding temperature and pressure, and circuit board flatness. Furthermore, solder joints are susceptible to failure due to fatigue from temperature cycling in an operating environment.

Excess solder volume can cause short circuits if not tightly controlled. If there is too much solder between via pads, the risk of shorting the via to ground is increased. A lack of adequate solder volume increases the risk that the area between via pads will be starved of solder causing an open circuit or poor RF transition. Solder composition controls the tensile strength and melting point of the solder. For example, a higher percentage (e.g., 90%) of lead results in more malleable solder (i.e., less brittle and less sensitive to cracking) but significantly increases the melting point (e.g., from 275 to 302° C.). The higher melting point requires higher temperatures to be used in stripline subassembly fabrication. Conversely, higher percentage (e.g., 90%) tin composition results in higher tensile strength (but more brittleness) and lower melting point (e.g., 183–210° C.). Moreover, the limited range of usable melting points restricts the number of times an assembly can be processed. Each sequential processing step must be performed at a relatively lower temperature in order to avoid re-melting solder from a previous step. This limitation restricts the number of RF circuits that can be reliably interconnected in a sub-assembly and, therefore, limits the functionality of the radar system antenna or communications system antenna.

The difficulty in controlling board flatness exacerbates soldering process problems because no two boards to be interconnected are perfectly flat. Soldering limitations require two Printed Wiring Boards (PWBs) to be flat and parallel within, e.g., 0.003"–0.004", in order to assure the solder will bridge the gap between connections on the boards to be interconnected. Providing boards having a flatness within 0.003"–0.004" requires relatively demanding tolerances during the design and fabrication of the PWBs. Some of the flatness limitations can be resolved by soldering the PWBs together in a press, but higher pressures result in more solder flow. This additional solder flow can cause shorting between signal pads and ground planes. Bonding temperature affects solder flow and also requires precise control of the time-temperature profile. For example, there must be a steep rate of temperature decline after the solder transitions from a solid to a liquid. Otherwise, the tin in the solder will oxidize, which weakens the solder joint.

In another conventional approach, referred to as the pin approach, pins are soldered into vias. This approach attempts to mitigate difficulties due to board flatness limitations by using pins to bridge the gap between vias to provide interconnection. Pins are soldered or bonded into vias on one PWB. Then, as the PWBs are assembled, the pins fit into matching vias on the opposite PWB to connect the RF circuits. Pin approach reliability is reduced by the same process restrictions noted above for the via pad soldering approach. In addition, the pin approach is exceptionally sensitive to process variances such as pin alignment, pin and via dimensional tolerances, and solder volume because the pin fills most of hole.

Proper pin alignment assures that the pin goes up inside the via of the mating board. Pin and via dimensional tolerances are relatively tight, because via drill size, plating and pin diameter determine whether the pin fits correctly into the via. Vent holes are sometimes required in conventional approaches in order to allow gasses to escape during the soldering process. All of the above mentioned process variances contribute to unpredictable, parasitic circuit reactance that can severely degrade the RF performance of a radar or communications antenna.

In a further conventional approach, so-called Z-axis adhesive films are used to interconnect multiple layers of Polytetrafluoroethylene (PTFE) RF transmission line circuits.

This approach requires precise cutting and placement of the adhesive film between via pads. In addition, this approach suffers from mechanically and/or environmentally induced failures due to temperature cycling, humidity, salt fog, etc.

The high cost and limited reliability of many conventional phased array systems has restricted their use across platforms, applications and frequencies. Many military radar and communication systems require high functionality (e.g., multiple beams, multiple frequency bands) combined with lightweight and low-profile tile arrays. Conventional systems have complicated front-ends often incorporating semi-rigid coaxial cables and epoxies. In contrast, tile arrays offer a low cost alternative to producing highly integrated phased arrays. Tile array fabrication is based on a batch process production of multiple board layers and a correspondingly large number of vertical interconnections. In commercial applications, for example "smart antenna arrays" for the cellular phone market, it is often desirable to integrate RF antenna arrays and associated feed circuitry into low cost, low profile, high reliability packaging. From the L-Band through the Ka-Band, radar and commercial wireless applications are pushing higher functional integration and lower cost. Tile array based multi-layer laminates containing RF transmission lines and passive and active devices offer a compact and low-cost solution.

It would, therefore, be desirable to provide a reliable, low cost method of interconnecting stripline circuits in a multi-layer laminate assembly. It would be further desirable to provide a method enabling subsequent sub-assemblies to be repeatedly stacked without affecting critical dimensions or introducing unpredictable parasitic circuit reactance.

SUMMARY OF THE INVENTION

In accordance with the present invention, a multi-layer stripline assembly interconnection includes a first stripline sub-assembly having a first surface and a first plurality of vias disposed in the first surface adapted to receive a plurality of solid metal balls. The interconnection further includes a second stripline sub-assembly having a second plurality of vias disposed in the first surface of the second sub-assembly adapted to be aligned with the corresponding first plurality of vias. Reflowed solder is wetted to the second plurality of vias and to the corresponding first plurality of vias. With such an arrangement, a low cost multiple RF stripline circuit having improved reliability, reduced RF losses, improved signal to noise ratio (S/N), and mechanical integrity is provided.

In accordance with a further aspect of the present invention, a method for interconnecting multilayer stripline radio frequency (RF) circuits includes providing a first stripline sub-assembly, having a plurality of vias disposed on a first surface of the first stripline sub-assembly, and a second stripline sub-assembly having a plurality of vias disposed on a first surface of the second stripline sub-assembly. The method further includes depositing each of a plurality of solid metal balls into selected ones of the plurality of vias disposed on the first surface of the first stripline sub-assembly, depositing a volume of solder into selected ones of the plurality of vias disposed on the first surface of the first stripline sub-assembly and reflowing the solder on the first stripline sub-assembly at a first temperature such that each of the plurality of solid metal balls is in fluid contact with a corresponding one of the plurality of vias disposed on a first surface of the first stripline sub-assembly. The method can further include disposing an epoxy sheet on the first surface of the second stripline sub-assembly, dispensing conductive epoxy into selected ones of the plurality of vias disposed on the first surface of the second stripline sub-assembly, and bonding the first surface of the first stripline sub-assembly to the first surface of the second stripline sub-assembly at a second temperature, such that the epoxy sheet is set. The second temperature should be lower than the first temperature.

With such a technique, a cost effective way to interconnect multiple RF stripline circuits in repeatable bonding steps is provided by combining drilling, copper plating, etching and lamination of Teflon based or ceramic laminates, and surface mounting techniques. This inventive process provides high performance, multi-layer RF circuits, minimizes the number of part types and process steps and does not require vent holes. In addition, process control tolerances (e.g., temperature, pressure, volume of solder and epoxy, solder composition, exact location of the ball, and via dimension) can be relaxed. This technique also provides for laminating a relatively large number of unit cells in multiple bonding steps by providing a method for repeatedly stacking sub-assemblies with minimal effect on certain dimensions and without introducing unpredictable parasitic circuit reactance.

In one embodiment, a conductive thermoset epoxy is used to provide the epoxy and epoxy sheet. The thermoset properties allow a procedure that can be repeated to bond a number of sub-assemblies together to realize a tile phased array architecture. The ball grid array interconnect (BGAI) arrangement enables the realization of a high performance, low cost, lightweight and low profile Tile Phased Array operating over a range including the L-Band up through the Ka-Band. The arrangement of additional multiple layers provides added functionality in the feed circuit and radiator layers and can include, for example, analog to digital (A/D) converters and more complex beam forming circuitry than can be provided with conventional interconnections. The use of thermoset materials enables the production of highly integrated, RF circuits demanded by high performance radars and communications systems.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Before describing the radar system of the present invention, it should be noted that reference is sometimes made herein to antenna assemblies having a particular array shape (i.e. a linear array or planar array). One of ordinary skill in the art will appreciate of course that the techniques described herein are applicable to various sizes and shapes of antenna assemblies. It should thus be noted that although the description provided below describes the inventive concepts in the context of a rectangular assemblies, those of ordinary skill in the art will appreciate that the concepts equally apply to other sizes and shapes of array antennas including, but not limited to, arbitrary shaped planar array antennas as well as cylindrical, conical, spherical and arbitrarily shaped conformal array antennas.

Reference is also sometimes made herein to the array antenna including a radiating element of a particular type, size and shape. For example, one type of radiating element is a so-called patch antenna element having a square shape and a size compatible with operation at a particular frequency (e.g. 10 GHz). Those of ordinary skill in the art will recognize, that other shapes and types of antenna elements may also be used and that the size of one or more radiating elements may be selected for operation at any frequency in the RF frequency range (e.g. any frequency in the range of about 1 GHz to about 100 GHz). The types of radiating elements which may be used in the antenna of the present invention include, but are not limited to, notch elements, dipoles, slots or any other radiating elements known to those of ordinary skill in the art.

Figure 1:
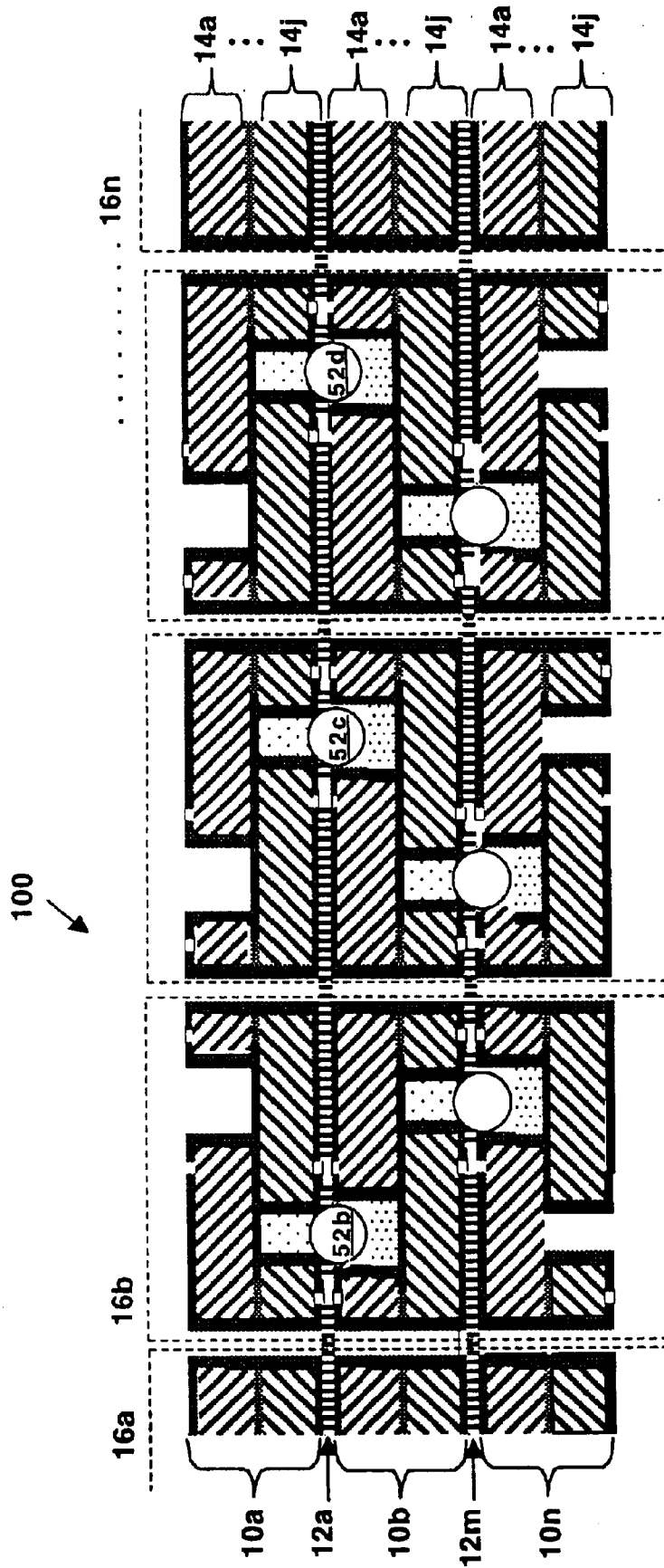
FIG. 1 is a cross section view of multiple sub-assemblies of a system interconnected in accordance with the present invention.

Referring now to FIG. 1, an exemplary communications system antenna assembly 100 includes a plurality of PWB sub-assemblies 10a–10n (generally referred to as sub-assemblies 10) interconnected by a plurality of ball grid array interconnects (BGAI) 12a–12m (generally referred to as BGAI 12). A portion of the BGAI 12a includes a plurality of solid metal balls 52b–52d. Each sub-assembly 10 includes multiple board layers 14a–14j. The antenna assembly 100 includes a plurality of unit cells 16a–16n. The unit cells can be arranged in arbitrary patterns including but not limited to: rectangular, square, triangular, radial, and spiral shaped patterns. More sub-assemblies 10 can be interconnected using the BGAIs 12 of the present invention than by conventional interconnect means because the use of thermoset materials allows multiple interconnections (as described in more detail in conjunction with FIGS. 2–7) and because alignment tolerances between sub-assemblies 10 are relaxed and within known Printed Wiring Board (PWB) processes. Although reference is made herein to a communications system antenna assembly, those of ordinary skill in the art will appreciate that the inventive interconnection methods can be used to fabricate variety of assemblies including radar system antennas.

Figure 2:
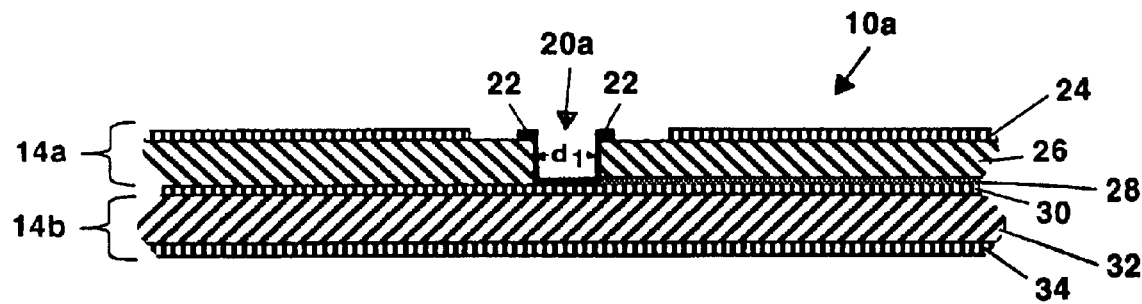
FIG. 2 is a cross section view of the first sub-assembly of FIG. 1 before interconnection.
Figure 2A:
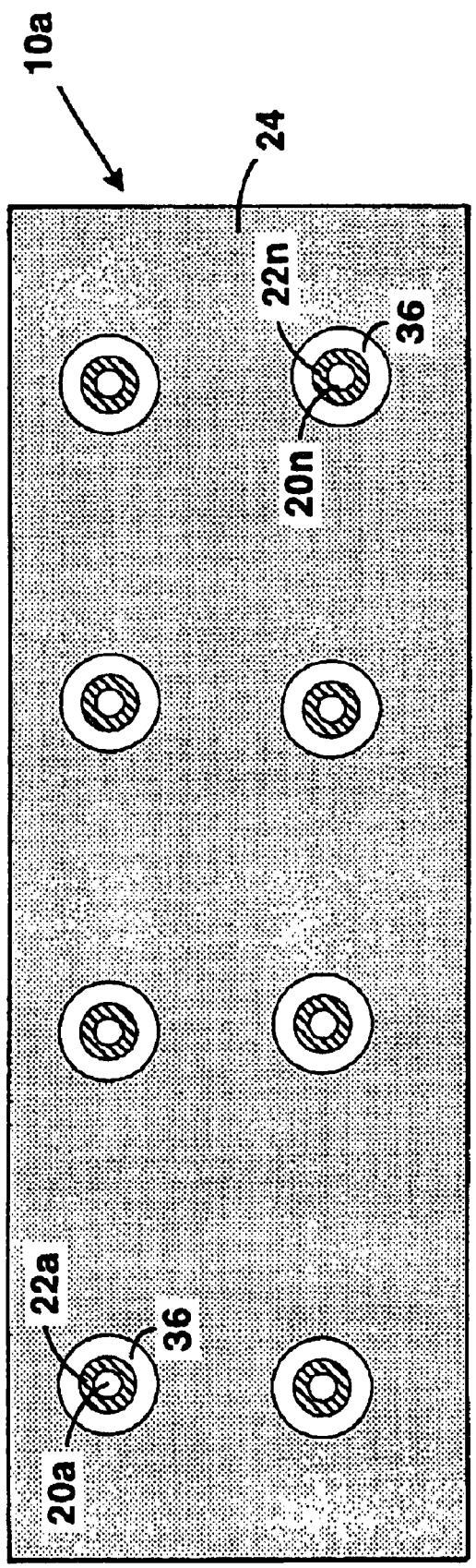
FIG. 2A is a top view of the first sub-assembly of FIG. 2.

Now referring to FIGS. 2 and 2A, a first stripline sub-assembly 10a includes a first board layer 14a disposed on a second board layer 14b. The first layer board layer 14a includes a plurality of plated via 20a–20n (generally referred to as via 20). For clarity only a portion of the stripline sub-assembly 10a and a single via 20a are shown. The via 20a includes an annular pad 22a. The first board layer 14a further includes a first ground plane 24 which is disposed on a first board core 26 and a stripline circuit 28 which is disposed on the first board core 26 and coupled to the plated via 20a. The stripline sub-assembly 10a includes a non-conductive adhesive layer 30 disposed between the first board layer 14a and the second board layer 14b. The second board layer 14b includes a second board core 32 and a second ground plane 34 disposed on the second board core 32. It will be appreciated by those of ordinary skill in the art that the construction of the sub-assemblies can include additional board layers and other configurations of board cores, non-conductive adhesives, vias and stripline circuits. For example the second board core can include a plurality of vias (not shown).

In one particular embodiment, the sub-assembly 10a includes a multi-layer RF stripline circuit, copper ground planes 24, 34, and Polytetrafluoroethylene (PTFE) board cores 26, 32. It will be appreciated by those of ordinary skill in the art that the sub-assemblies can include, but are not limited to, ceramic-fiber filled PTFE, glass-fiber filled PTFE, woven-glass reinforced PTFE, thermoset polymer composite board assemblies or glass reinforced hydrocarbon/ceramic board assembles. The interconnect method described below in detail can be used to connect both hard (ceramic) and soft PTFE board assemblies. The stripline sub-assemblies 10 can be fabricated using conventional printed wire board (PWB) processes.

Now referring to FIG. 2A a top view of the sub-assembly of FIG. 2 in which like reference numbers refer to like elements, the first stripline sub-assembly 10a includes a first layer board layer 14a which includes a plurality of plated vias 20a–20n (generally referred to as via 20) having an annular pad 22. Each annular pad 22 is surrounded by an insulated region 36 in the first ground plane 24 which isolates the via 20 from the ground plane 24. The vias 20 form a base for the BGAI 12 (FIG. 1).

Figure 3:
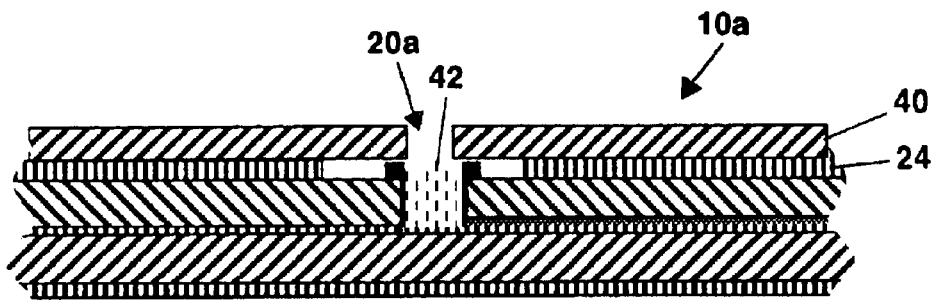
FIG. 3 is a cross section view of the first sub-assembly of FIG. 2 showing the addition of solder paste.

Now referring to FIG. 3 in which like reference numbers refer to like elements of FIG. 2, the first stripline sub-assembly 10a is prepared for interconnection by temporarily attaching a solder paste mask 40 to the top of the first ground plane 24. After the mask 40 is attached, a relatively small amount of solder paste 42 is introduced into via 20a which will be used for interconnection of the solid metal ball (not shown) to the via 20. In one embodiment, the solder paste 42 includes both solder and a solder flux for preparing the surface of each via 20. The solder paste 42 can be applied using known Surface Mount Technology (SMT) processes, for example. Alternatively, the via 20a can be solder plated using known Printed Wiring Board (PWB) processes.

Figure 4:
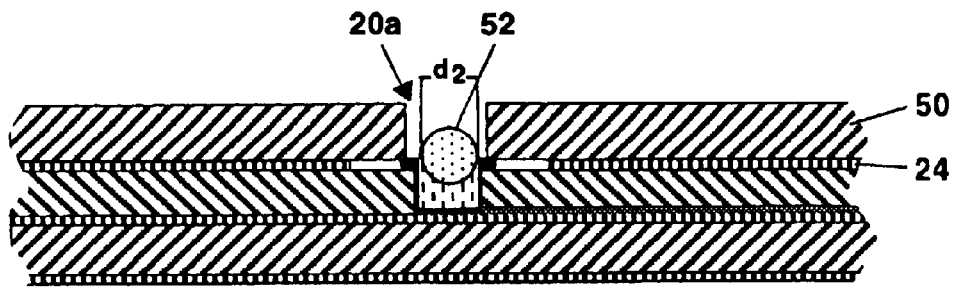
FIG. 4 is a cross section view of the first sub-assembly of FIG. 2 showing the addition of a mask and solder ball.

Now referring to FIG. 4 in which like reference numbers refer to like elements of FIG. 2, a plurality of solid metal balls 52a–52n (also referred to as solder balls 52 and generally referred to as solid metal balls 52) are disposed on a top portion of the plurality of vias 20 by first temporarily attaching a solder ball mask 50 to the top of the first ground plane 24. For clarity only a single via 20a and a single solid metal ball 52 are shown. After the mask 50 is attached, the solid metal balls 52, here for example a plurality of tin-lead alloy metal balls that readily wet to solder paste (or solder plating), are introduced one per via 20 using known Surface Mount Technology (SMT) processes as described in more detail in conjunction with the flow diagram shown in FIG. 8.

Figure 5:
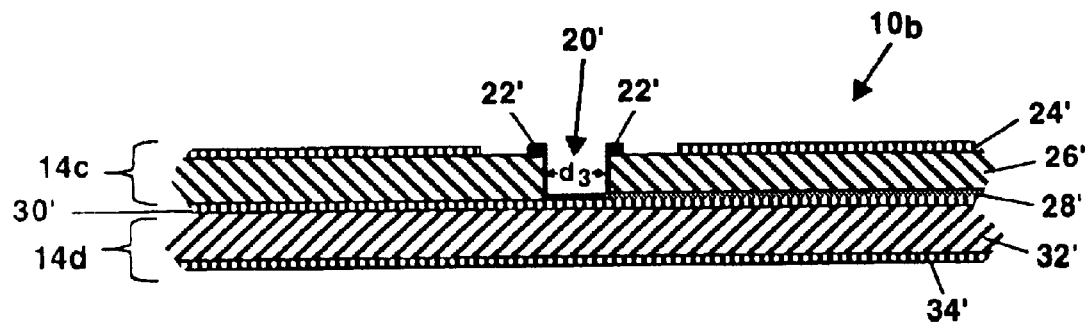
FIG. 5 is a cross section view of a second sub-assembly before preparation for assembly in accordance with the present invention.

Now referring to FIG. 5 in combination with FIG. 2 in which like reference numbers refer to like elements, a second stripline sub-assembly 10b includes a first layer board layer 14c disposed on a second board layer 14d. The first layer board layer 14c includes a plurality of plated vias 20a'–20n' (generally referred to as via 20'), each via 20' having an annular pad 22'. For clarity only a single via 20' is shown. The first layer board layer 14c further includes a first ground plane 24' disposed on a first board core 26' and a stripline circuit 28' disposed on the first board core 26'. The second stripline sub-assembly 10b includes a non-conductive adhesive layer 30' which is disposed between the first board layer 14c and the second board layer 14d. The second board layer 14d includes a second board core 32', a second ground plane 34' disposed on the second board core 32', and can include a plurality of vias (not shown).

The location of the plurality of vias 20' corresponds to the location of the plurality of vias 20 in the first stripline sub-assembly 10a. The vias 20' have a larger diameter than the corresponding vias 20 in the first stripline sub-assembly 10a. In one embodiment, the via 20' diameter $d_3$ is greater than the solid metal ball diameter $d_2$ (FIG. 4) by approximately 10 mils and the solid metal ball 52 diameter $d_2$ is greater than the via 20 diameter $d_1$ (FIG. 2) by approximately 5 mils.

Figure 6:
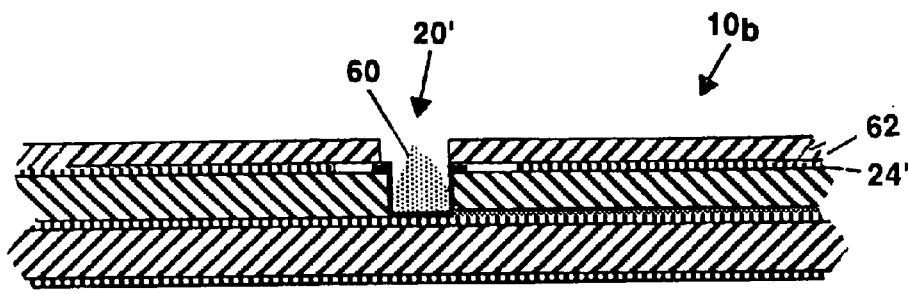
FIG. 6 is a cross section view of a second sub-assembly of FIG. 5 after the addition of conductive epoxy in a via and a conductive epoxy sheet.

Now referring to FIG. 6, the second stripline sub-assembly 10b prepared for interconnection includes a conductive epoxy sheet 62 disposed on the top of the first ground plane 24' and a portion of conductive epoxy 60 disposed in each via 20' adapted to receive the corresponding solid metal ball 52 (FIG. 4). In one embodiment, the epoxy sheet 62 is provided by a commercially available conductive epoxy, Ablefilm® 5025E having a thickness of approximately from 2 to 4 mils and Ablefilm® 84-1LMI, having similar conductive and thermal properties can be used as the epoxy paste 60. The Ablefilm® products are manufactured by the National Starch and Chemical Company. The epoxy sheet 62 provides a structure to fill voids between the sub-assemblies 10a and 10b. Ablefilm® 5025E and Ablefilm® 84-1LMI are thermoset materials that cure once after initial heat and compression which makes these materials practical for a multi-step lamination process. Moreover, the cure cycle for Ablefilm® 5025E is relatively insensitive to the maximum time at the bonding temperature (i.e., the minimum time is 1 hour at 150° C.). The use of a thermoset conductive epoxy offers additional advantages: (1) excellent electrical and thermal conductivity in the x, y and z-axes; (2) minimal squeeze-out during bonding so that shorts are relatively less probable near vias and board flatness becomes less of an issue (allowing larger boards to be bonded together); (3) meets NASA out-gassing requirements and is MIL-STD-883 (Method 511) compliant; and (4) the epoxy is amenable to punch or laser cutting. In one embodiment, the conductive epoxy paste is first dispensed into each via 20'. Then a pre-drilled conductive epoxy sheet, with tooling holes that align it with the board, is placed over layer 24'. The conductive epoxy is dispensed through a hollow point needle or alternatively is screened into the vias. It will be appreciated by those of ordinary skill in the art that other types of thermoset materials can be used as the epoxy 60 and conductive epoxy paste 62 material.

Making the via 20' diameter (with the conductive epoxy) larger than the via 20 in the first sub-assembly 10a allows the solid metal ball 52 to extend further inside the larger via increasing the surface area for the bond and allowing for alignment tolerances between board sub-assemblies. Thus, the interconnect alignment does not depend on the bond between the via pads or delicate control of alignment and soldering of pins. In one particular embodiment, for example, a Tile Based Subarray uses a 0.0126-inch diameter via, 0.015-inch diameter solid ball and a 0.025-inch diameter via in a relatively tight unit-cell triangular lattice (0.520 inch by 0.600 inch) at X-Band frequencies.

Figure 7:
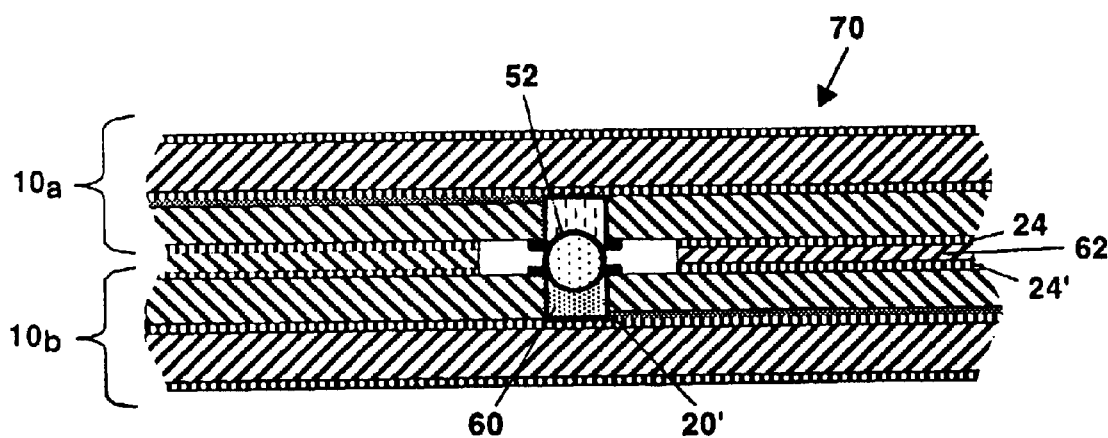
FIG. 7 is a cross-section view of the interconnection of the first sub-assembly of FIG. 4 and the second sub-assembly of FIG. 6.

Now referring to FIG. 7 in which like reference numbers refer to like elements in FIGS. 4 and 6, an interconnected assembly 70 includes the first stripline sub-assembly 10a of FIG. 4 bonded to the second stripline sub-assembly 10b of FIG. 6. The solid metal ball 52 is bonded to the plated via 20' with the conductive epoxy 60, which is in electrical contact with the solid metal ball 52 and the sidewalls and bottom of the via 20'. The first copper ground 24 of the first stripline sub-assembly 10a is bonded by means of the conductive epoxy sheet 62 to form a mechanical and electrical interconnection with the first copper ground 24' of the second stripline sub-assembly 10b.

Figure 8:
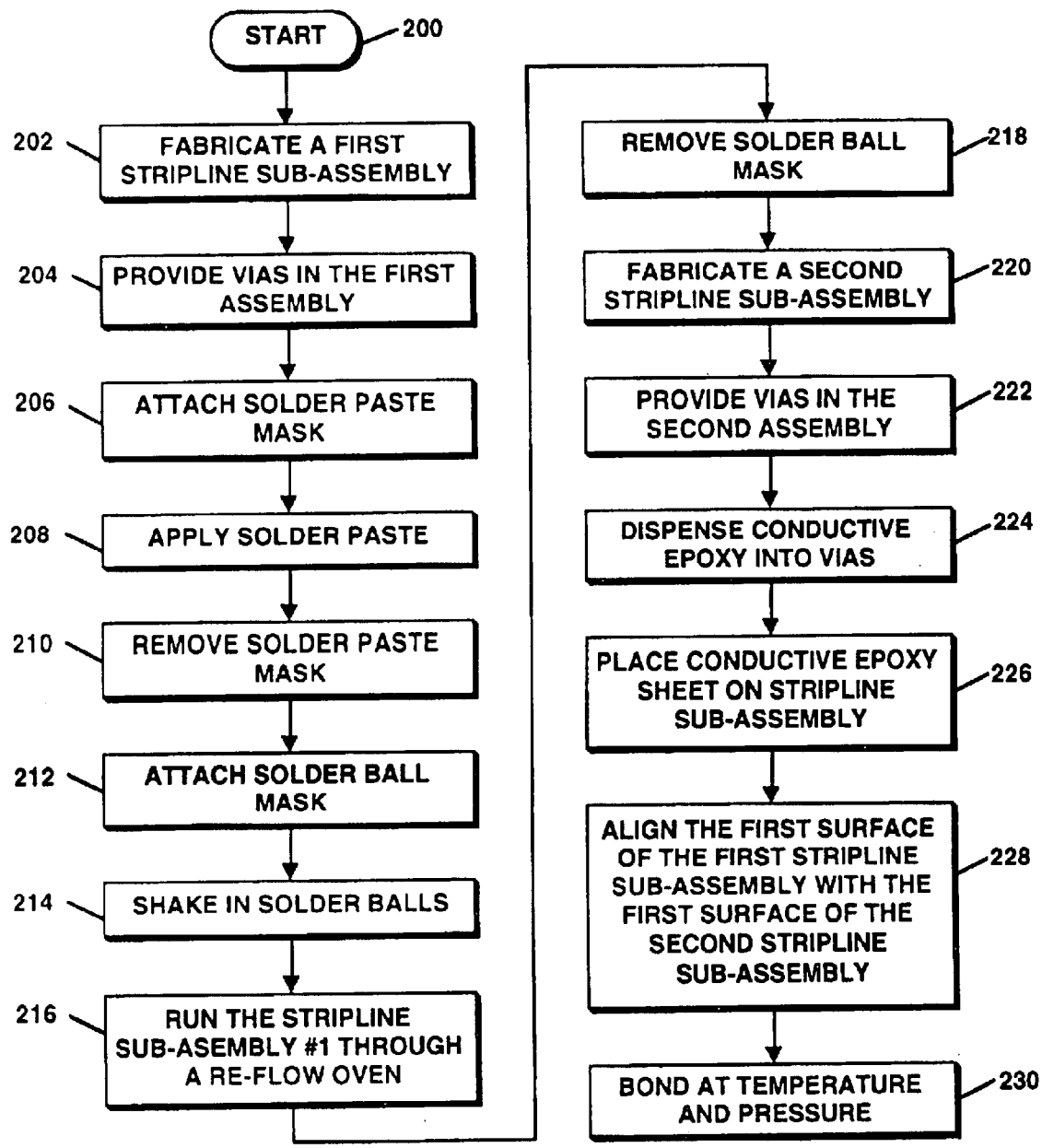
FIG. 8 is a flow diagram illustrating the steps to interconnect two RF stripline sub-assemblies in accordance with the present invention.

Now referring to FIG. 8, a flow diagram illustrates exemplary steps to interconnect two RF stripline sub-assemblies in accordance with the present invention. The procedure starts at step 200. At step 202, a first stripline sub-assembly 10a (FIG. 2) is fabricated using standard PWB processes for the multi-layer stack-up. At step 204, vias 20 (FIG. 2) are provided corresponding to the required interconnection between successive sub-assemblies.

At step 206, a solder paste mask 40 (FIG. 3) is attached temporarily to the top of the first ground plane 24. The mask 40 is aligned with the first sub-assembly 10a by using a plurality of alignment pins (not shown). At step 208, SMT techniques are used to apply solder paste 42 to the top of the vias on the first stripline sub-assembly 10a using mask 40 after which the mask 40 is removed at step 210. In one embodiment, the solder paste 42 includes solder plus flux. In another embodiment, the vias 20 can be solder plated using known PWB processes. The solder ball mask 50 holds the solid metal balls 52 in place as the sub-assembly 10a travels through a reflow oven. Once the solder in the solder paste 42 (or solder plating) starts to melt, the solid metal ball 52 is in fluid contact with the via 20 and drops as a function of its size and weight further into the via 20 until the walls of the via interfere with the solid metal ball's 52 movement. The solder flows and provides a bond between the ball and walls of the via 20.

At step 212, a solder ball mask 50 (FIG. 4) is attached temporarily to the top of the first ground plane 24. The mask 50 is aligned with the first sub-assembly 10a by using a plurality of alignment pins. At step 214, SMT techniques are used to shake in a solid metal ball 52 into each via 20 on the first stripline sub-assembly 10a. The holes in the mask 50 allow only one solid metal ball 52 per via 20. In one embodiment, all the vias receive a solder ball.

At step 216, the first sub-assembly 10a with the attached solid metal balls 52 is processed in the reflow oven. The time and temperature parameters are set to cause solder paste 42 and the solid metal balls 52 to melt enough to wet the sidewalls of the vias 20, but retain a substantially spherical shape. Note that unlike other conventional techniques no venting is required for the reflow process.

At step 220, a second stripline sub-assembly 10b (FIG. 5) is fabricated using standard PWB processes for the multi-layer stack-up. At step 222, vias 20' are provided corresponding to vias 20 on the first stripline sub-assembly 10a. The vias 20 having attached solid metal balls 52 and the vias 20' form the required interconnection between successive sub-assemblies when the interconnection process is completed. At step 224, conductive epoxy 60 (FIG. 6) is dispensed into vias 20'.

At step 226, a conductive epoxy sheet 62 (FIG. 7) is disposed on the second stripline sub-assembly 10b. The conductive epoxy sheet 62 is aligned with the second sub-assembly 10b by using a plurality of alignment pins (not shown). At step 228, the protruding solid metal balls 52 of first stripline sub-assembly 10a are aligned with the wider vias 20' second stripline sub-assembly 10b using a plurality of alignment pins (not shown). It should be appreciated that although steps 220 through steps 226 are shown after steps 202 through 218 in the flow diagram, typically steps 220 through steps 227 are performed in parallel with and/or independently from steps 202 through 218.

At step 230, the aligned first and second sub-assemblies 10a, 10b are bonded at controlled known temperatures and pressures specified for the thermoset materials being used. The two sub-assemblies 10a, 10b are now mechanically and electrically interconnected. The temperature and pressure do not have to be tightly controlled to set the thermoset material (i.e. epoxy 60 and conductive epoxy sheet 62). Once set, the thermoset material is not affected by subsequent bonding operations at the same temperature and pressure. This property of the thermoset material allows subsequent interconnection of the combined sub-assemblies 10a and 10b to be further bonded with additional sub-assemblies 10. Steps 202–230 can be repeated with additional sub-assemblies 10 to provide the communications system antenna assembly 100.

It will be appreciated by those of ordinary skill in the art that multiple sub-assemblies 10 can be bonded in a single step by providing a plurality of sub-assemblies 10 with solid metal balls 52 on one surface of the sub-assembly. Alternatively, individual sub-assemblies can be bonded to the interconnected assembly 70 (FIG. 7) one sub-assembly 10 at a time to form additional layers of circuitry on the interconnected assembly 70. In an alternate embodiment, additional passive components-(e.g., circulators, isolators) and active components (e.g., A/D converters, ASIC's, Low Noise Amplifiers) can be placed between PTFE board cores 26 and 32 (FIG. 2) and integrated into a multi-layer laminate interconnected by the plurality of a ball grid array interconnects 12 (FIG. 1).

It should now be appreciated that one inventive concept in the present invention includes an interconnection having a first via disposed in a first sub-assembly; a second via disposed in a second sub-assembly, and a metal ball disposed between the first via and second via and adapted to electrically connect the first via with the second via. Furthermore, the metal ball facilitates aligning the first via with the second via and such aligning can be improved by providing the second via with a larger diameter than the first via. Finally conductive epoxy disposed about the metal ball and the via ensures electrical conductivity between the via and the metal ball.

All publications and references cited herein are expressly incorporated herein by reference in their entirety.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

What is claimed is:

1. A method for interconnecting multilayer stripline radio frequency (RF) circuits comprising:
    providing a first stripline sub-assembly, the first stripline sub-assembly having a first plurality of vias disposed on a first surface of the first stripline sub-assembly;
    providing a second stripline sub-assembly, the second stripline sub-assembly having a second plurality of vias disposed on a first surface of the second stripline sub-assembly;
    depositing a volume of solder into selected ones of the first plurality of vias;
    depositing each of a plurality of solid metal balls into selected ones of the first plurality of vias;
    re-flowing the volume of solder on the first stripline sub-assembly at a first temperature such that each of the plurality of solid metal balls is in fluid contact with a corresponding one of the first plurality of vias;
    disposing a epoxy sheet on the first surface of the second stripline sub-assembly;
    dispensing conductive epoxy into selected ones of the second plurality of vias; and
    bonding the first surface of the first stripline sub-assembly to the first surface of the second stripline sub-assembly at a second temperature such that the epoxy sheet is set and wherein the second temperature is lower than the first temperature.

2. The method of claim 1 wherein the epoxy sheet comprises thermoset epoxy.

3. The method of claim 2 wherein the thermoset epoxy is conductive.

4. The method of claim 1 wherein the volume of solder comprises solder paste.

5. The method of claim 1 further comprising providing a solder paste mask disposed on the first surface of the first stripline sub-assembly.

6. The method of claim 1 further comprising aligning the first surface of the first stripline sub-assembly with the first surface of the second stripline sub-assembly such that the plurality of solid metal balls is adjacent a corresponding via of the second stripline sub-assembly.

7. The method of claim 1 wherein bonding comprises bonding at temperature and pressure.

8. The method of claim 1 further comprising bonding a third sub-assembly to the two bonded sub-assemblies.

9. The method of claim 1 wherein depositing each of a plurality of solid metal balls comprises shaking in solid metal balls.

10. The method of claim 1 wherein the epoxy is a thermoset epoxy.

11. The method of claim 1 wherein depositing each of a plurality of solid metal balls comprises providing a mask which allows only one ball per via.

12. The method of claim 1 wherein the volume of solder comprises solder plating on the first plurality of vias.

13. A method of interconnecting multilayer stripline radio frequency (RE) circuits comprising:
    providing a first stripline sub-assembly, the first sub-assembly having a first plurality of vias, disposed on a first surface;
    providing a second stripline sub-assembly, the second sub-assembly having a second plurality of vias, disposed on a first surface;
    applying solder to the first plurality of vias; providing a plurality of solid metal balls;
    re-flowing the solder on the first stripline sub-assembly;
    placing conductive epoxy sheet on the first surface of the second stripline sub-assembly;
    dispensing conductive epoxy into the second plurality of vias;
    aligning the first surface of the first stripline sub-assembly with the first surface of the second stripline sub-assembly such that each of the plurality of solid metal balls is adjacent a corresponding one of the second plurality of vias; and bonding the first surface of the first stripline sub-assembly to the first surface of the second stripline sub-assembly.

14. The method of claim 13 wherein applying solder comprises:

providing a mask disposed on the first surface of the first stripline sub-assembly; and depositing solder paste in the first plurality of vias.

15. The method of claim 13 wherein applying solder comprises solder plating the first plurality of vias.

16. A multi-layer stripline assembly interconnection comprising:

a first stripline sub-assembly having a first surface;

a first plurality of vias disposed in the first surface of the first stripline sub-assembly;

a first plurality of solid metal balls, each disposed in a respective one of the first plurality of vias;

a second stripline sub-assembly having a first surface;

a second plurality of vias disposed in the first surface of the second sub-assembly adapted to be aligned with the corresponding first plurality of solid metal balls; and reflowed solder wetted to the second plurality of vias and to the first plurality of solid metal balls.

17. The assembly of claim 16 wherein the reflowed solder comprises conductive epoxy.

18. The assembly of claim 16 wherein the reflowed solder comprises solder plating on the second plurality of vias.

19. The assembly of claim 16 further comprising a plurality of stripline circuits coupled to the first and second plurality of vias.

20. The assembly of claim 16 wherein the first stripline sub-assembly includes a second surface and a third plurality of vias disposed therein; and a second plurality of solid metal balls, each disposed in a respective one of the third plurality of vias.

* * * * *

UNITED STATES PATENT AND TRADEMARK OFFICE
CERTIFICATE OF CORRECTION

PATENT NO. : 6,731,189 B2
DATED : May 4, 2004
INVENTOR(S) : Angelo Puzella et al.

It is certified that error appears in the above-identified patent and that said Letters Patent is hereby corrected as shown below:

Column 5,
Line 12, reads "of a rectangular" and should read -- of rectangular --.

Column 6,
Line 8, reads "For example the" and should read -- For example, the --.

Column 8,
Line 50, reads "techniques no" and should read -- techniques, no --.

Column 9,
Line 45, reads "Finally conductive" and should read -- Finally, conductive --.

Column 10,
Line 48, reads "(RE)" and should read -- (RF) --.
Line 55, reads "vias; providing a" and should read --vias; providing a --.

Signed and Sealed this

First Day of February, 2005

JON W. DUDAS
*Director of the United States Patent and Trademark Office*